(12) United States Patent
DeBoer

(10) Patent No.: US 6,326,277 B1
(45) Date of Patent: Dec. 4, 2001

(54) METHODS OF FORMING RECESSED HEMISPHERICAL GRAIN SILICON CAPACITOR STRUCTURES

(75) Inventor: Scott J. DeBoer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/385,787

(22) Filed: Aug. 30, 1999

(51) Int. Cl.[7] ................................................. H01L 21/20
(52) U.S. Cl. ............................................. 438/398; 438/238
(58) Field of Search ..................................... 438/255, 398, 438/386, 245, 387, 388, 658, 254, 253, 238; 257/300, 301, 302, 303, 306, 309

(56) References Cited

U.S. PATENT DOCUMENTS

| | | |
|---|---|---|
| 4,803,535 | 2/1989 | Taguchi . |
| 5,270,241 | 12/1993 | Dennison et al. . |
| 5,283,453 | 2/1994 | Rejeevakumar . |
| 5,384,152 | 1/1995 | Chu et al. . |
| 5,392,189 | 2/1995 | Fazan et al. . |
| 5,407,534 | 4/1995 | Thakur . |
| 5,418,180 | 5/1995 | Brown . |
| 5,521,407 | 5/1996 | Kohyama et al. . |
| 5,555,520 | 9/1996 | Sudo et al. . |
| 5,753,558 * | 5/1998 | Akram et al. .......................... 438/386 |
| 5,759,262 | 6/1998 | Weimer et al. . |
| 5,837,580 | 11/1998 | Thakur et al. . |
| 5,882,979 | 3/1999 | Ping et al. . |
| 5,963,814 * | 10/1999 | Walker et al. ......................... 438/387 |
| 6,046,083 * | 4/2000 | Lin et al. .............................. 438/255 |
| 6,159,785 * | 12/2000 | Tsuchimoto et al. ................. 438/238 |

* cited by examiner

Primary Examiner—David Nelms
Assistant Examiner—David Vu
(74) Attorney, Agent, or Firm—Mueting, Raasch & Gebhardt, P.A.

(57) ABSTRACT

Methods of manufacturing capacitor structure with edge zones that are substantially free of hemispherical grin silicon along the upper edges of the. capacitor structures a disclosed. The resulting recessed hemispherical grain silicon layers reduce or prevent separation of particles from the hemispherical grain silicon layer during subsequent manufacturing processes, thereby reducing defects and increasing throughout. Among the methods of the present invention are methods of forming the capacitor structures in which the silicon layer used to form the hemispherical grain silicon is selectively doped. That selective doping provides an edge zone that does not convert to hemispherical gain silicon during manufacturing.

27 Claims, 5 Drawing Sheets

METHODS OF FORMING RECESSED HEMISPHERICAL GRAIN SILICON CAPACITOR STRUCTURES

FIELD OF THE INVENTION

The present invention relates to semiconductor manufacturing. More particularly, the present invention provides methods of forming capacitor structures including recessed hemispherical grain silicon.

BACKGROUND OF THE INVENTION

In the fabrication of integrated circuits, various conductive layers are used. For example, during the formation of semiconductor devices, such as dynamic random access memories (DRAMs), static random access memories (SRAMs), ferroelectric (FE) memories, etc., conductive materials are used in the formation of storage cell capacitors and also may be used in interconnection structures, e.g., conductive layers of contact holes, vias, etc.

As memory devices become more dense, it is necessary to decrease the size of circuit components forming such devices. One way to retain storage capacity of storage cell capacitors of the memory devices and at the same time decrease the memory device size is to increase the dielectric constant of the dielectric layer of the storage cell capacitor. Therefore, high dielectric constant materials are used in such applications interposed between two electrodes. One or more layers of various conductive materials may be used as the electrode material.

Further, to the increase the capacitance for a storage cell capacitor of a memory device without increasing the occupation area of the storage cell capacitor, various techniques have been used to increase the surface area of the lower electrode of the capacitor. For example, hemispherical grains (HSG) have been used to enhance such surface area of the lower electrode of a capacitor of a memory device.

However, in many cases, the use of HSG to enhance surface area of an electrode can be problematic. The manufacturing of container capacitors, such as is described in U.S. Pat. No. 5,270,241 (Dennison et al.) involves a singulation process whereby the continuous conductive material lining the containers and extending between them on the upper surface of the structure is partially removed to separate the conductive material within a container from the conductive material in the other containers. Singulation may be accomplished using a chemical mechanical polishing (CMP) step which removes only the uppermost horizontal expanses of the continuous conductive layer.

Although CMP is effective at separating the containers, it leaves a structure in which the hemispherical grain silicon precursor layer (i.e., the layer from which the hemispherical grain silicon is formed) and the underlying doped silicon layer both extend to the upper edge of the capacitor plates. As a result, after conversion of the hemispherical grain silicon precursor layer to a layer of hemispherical grain silicon by, e.g., seeding and annealing or any other suitable technique, the hemispherical grain silicon layer typically extends above the outer layer of doped silicon along the edges of the capacitor plates.

Grains or particles from the edge of the hemispherical grain silicon layer are, however, susceptible to separation from the hemispherical grain silicon layer. Once separated or broken off, the loose particles can fall between adjacent capacitors because they extend above the outer layers of the containers, resulting in electrical shorts between the adjacent capacitors. Such defects adversely affect the output of the manufacturing processes used to form the capacitors. Although typically associated with cup-shaped capacitors, these problems may also be experienced in connection with other capacitor structures, e.g., trench, tub, etc.

SUMMARY OF THE INVENTION

The present invention provides methods of manufacturing capacitor structures with edge zones that are substantially free of hemispherical grain silicon along the upper edges of the capacitor structures. The resulting recessed hemispherical grain silicon layers reduce or prevent separation of particles from the hemispherical grain silicon layer during subsequent manufacturing processes, thereby reducing defects and increasing throughput.

Among the methods of the present invention are methods of forming the capacitor structures in which the silicon layer used to form the hemispherical grain silicon is selectively doped. That selective doping provides an edge zone that does not convert to hemispherical grain silicon during manufacturing.

In one aspect, the present invention provides a method of forming a capacitor structure by: providing a cavity in a substrate, the cavity including a sidewall structure, an opening in the upper surface of the substrate, and a bottom opposite the opening of the cavity; providing a first layer on an inner surface of the sidewall structure, wherein the first layer is electrically conductive; providing a second layer on substantially all of the first layer, the second layer including hemispherical grain silicon precursor; selectively doping the hemispherical grain silicon precursor in the second layer within an edge zone on the sidewall structure, the edge zone extending from the opening of the cavity towards the bottom of the cavity; and converting the undoped hemispherical grain silicon precursor in the second layer to hemispherical grain silicon, wherein the edge zone is substantially free of the hemispherical grain silicon.

In another aspect, the present invention provides a method of forming a capacitor structure by: providing a cavity in a substrate, the cavity including a sidewall structure, an opening in the upper surface of the substrate, and a bottom opposite the opening of the cavity, providing a first layer on an inner surface of the sidewall structure, wherein the first layer is electrically conductive; providing a second layer on substantially all of the first layer, the second layer including hemispherical grain silicon precursor; selectively doping the hemispherical grain silicon precursor in the second layer within an edge zone on the sidewall structure, the edge zone extending from the opening of the cavity towards the bottom of the cavity, wherein selectively doping includes implanting the hemispherical grain silicon precursor in the second layer with a dopant; and converting the undoped hemispherical grain silicon precursor in the second layer to hemispherical grain silicon, wherein the edge zone is substantially free of the hemispherical grain silicon.

In another aspect, the present invention provides a method of forming a capacitor structure by: providing a cavity in a substrate, the cavity including a sidewall structure, an opening in the upper surface of the substrate, and a bottom opposite the opening of the cavity; providing a first layer on an inner surface of the sidewall structure, wherein the first layer is electrically conductive; providing a second layer on substantially all of the first layer, the second layer including hemispherical grain silicon precursor; selectively doping the hemispherical grain silicon precursor in the second layer within an edge zone on the sidewall structure, the edge zone extending from the opening of the cavity towards the bottom of the cavity, wherein selectively doping includes implanting the hemispherical grain silicon precursor in the second layer with a dopant, the dopant being directed at an implantation angle relative to the sidewall structure of the cavity; and converting the undoped hemispherical grain silicon precursor in the second layer to hemispherical grain silicon, wherein the edge zone is substantially free of the hemispherical grain silicon.

In another aspect, the present invention provides a method of forming a capacitor structure by: providing a cavity in a substrate, the cavity including a sidewall structure, an opening in the upper surface of the substrate, and a bottom opposite the opening of the cavity; providing a first layer on an inner surface of the sidewall structure, wherein the first layer is electrically conductive; providing a second layer on substantially all of the first layer, the second layer including hemispherical grain silicon precursor; selectively doping the hemispherical grain silicon precursor in the second layer within an edge zone on the sidewall structure, the edge zone extending from the opening of the cavity towards the bottom of the cavity; providing a fill material within the cavity before selectively doping the hemispherical grain silicon precursor in the second layer; and converting the undoped hemispherical grain silicon precursor in the second layer to hemispherical grain silicon, wherein the edge zone is substantially free of the hemispherical grain silicon.

In another aspect, the present invention provides a method of forming a capacitor structure by: providing a cavity in a substrate, the cavity including a sidewall structure, an opening in the upper surface of the substrate, and a bottom opposite the opening of the cavity; providing a first layer on an inner surface of the sidewall structure, wherein the first layer is electrically conductive; providing a second layer on substantially all of the first layer, the second layer including hemispherical grain silicon precursor; selectively doping the hemispherical grain silicon precursor in the second layer within an edge zone on the sidewall structure, the edge zone extending from the opening of the cavity towards the bottom of the cavity, wherein selectively doping includes implanting the hemispherical grain silicon precursor in the second layer with a dopant; providing a fill material within the cavity before selectively doping the hemispherical grain silicon precursor in the second layer; and converting the undoped hemispherical grain silicon precursor in the second layer to hemispherical grain silicon, wherein the edge zone is substantially free of the hemispherical grain silicon.

In another aspect, the present invention provides a method of forming a capacitor structure by: providing a cavity in a substrate, the cavity including a sidewall structure, an opening in the upper surface of the substrate, and a bottom opposite the opening of the cavity; providing a first layer on an inner surface of the sidewall structure, wherein the first layer is electrically conductive; providing a second layer on substantially all of the first layer, the second layer including hemispherical grain silicon precursor; selectively doping the hemispherical grain silicon precursor in the second layer within an edge zone on the sidewall structure, the edge zone extending from the opening of the cavity towards the bottom of the cavity, wherein selectively doping includes implanting the hemispherical grain silicon precursor in the second layer with a dopant, the dopant being directed at an implantation angle relative to the sidewall structure of the cavity; providing a fill material within the cavity before selectively doping the hemispherical grain silicon precursor in the second layer; and converting the undoped hemispherical grain silicon precursor in the second layer to hemispherical grain silicon, wherein the edge zone is substantially free of the hemispherical grain silicon.

In another aspect, the present invention provides a method of forming a capacitor structure by: providing a cavity in a substrate, the cavity including a sidewall structure, an opening in the upper surface of the substrate, and a bottom opposite the opening of the cavity; providing a first layer on an inner surface of the sidewall structure, wherein the first layer is electrically conductive; providing a second layer on substantially all of the first layer, the second layer including hemispherical grain silicon precursor; selectively doping the hemispherical grain silicon precursor in the second layer within an edge zone on the sidewall structure, the edge zone extending from the opening of the cavity towards the bottom of the cavity; and converting the undoped hemispherical grain silicon precursor in the second layer to hemispherical grain silicon, wherein the edge zone is substantially free of the hemispherical grain silicon, and further wherein the edge zone extends over at least about 20% or less of the distance between the opening and the bottom of the cavity.

In another aspect, the present invention provides a method of forming a capacitor structure by: providing a cavity in a substrate, the cavity including a sidewall structure, an opening in the upper surface of the substrate, and a bottom opposite the opening of the cavity; providing a first layer on an inner surface of the sidewall structure, wherein the first layer is electrically conductive; providing a second layer on substantially all of the first layer, the second layer including hemispherical grain silicon precursor; selectively doping the hemispherical grain silicon precursor in the second layer within an edge zone on the sidewall structure, the edge zone extending from the opening of the cavity towards the bottom of the cavity; and converting the undoped hemispherical grain silicon precursor in the second layer to hemispherical grain silicon, wherein the edge zone is substantially free of the hemispherical grain silicon, and further wherein the edge zone has a depth of about 2000 Angstroms or less from the opening of the cavity.

These and other features and advantages of the invention are described below in connection with illustrative embodiments of the invention.

DETAILED DESCRIPTION OF THE ILLUSTRATIVE EMBODIMENTS OF THE INVENTION

Figure 1:
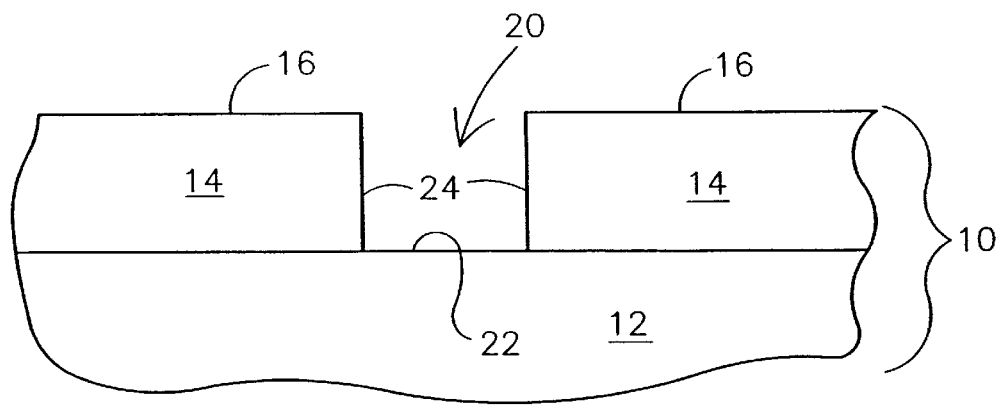
FIG. 1 is a cross-sectional view of an in-process capacitor structure at a stage in the fabrication following formation of a cavity 20.
Figure 2:
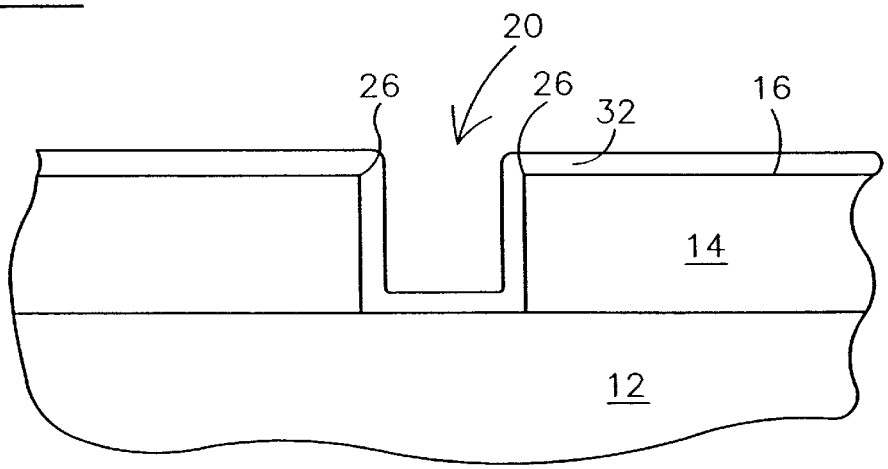
FIG. 2 is a cross-sectional view of the capacitor structure of FIG. 1 following formation of a first layer 32 in the cavity 20.

The present invention is particularly useful for providing the lower electrode of a capacitor structure for a memory device, e.g., a DRAM, an SRAM, an FE memory, etc. However, it should be understood that the methods of providing recessed hemispherical grain silicon layers can be used in any application or structure in which a recessed hemispherical grain silicon layer would be useful.

As used in this application, substrate assembly refers to either a semiconductor substrate such as the base semiconductor layer, e.g., the lowest layer of a silicon material on a wafer, or a silicon layer deposited on another material, such as silicon on sapphire, or a semiconductor substrate having one or more layers or structures formed thereon or regions formed therein. When reference is made to a substrate assembly in the following description, various process steps may have been previously used to form or define regions, junctions, various structures or features, and openings such as vias, contact openings, high aspect ratio openings, etc. For example, as used herein, substrate assembly may refer to a structure upon which a lower electrode of a capacitor structure is formed.

Although only one capacitor structure is illustrated in the drawings and discussed below, it will be understood that the capacitor may, and typically are, fabricated in arrays. In other words, a plurality of capacitor structures are manufactured simultaneously on substrate assemblies using the methods of the present invention.

FIGS. 1–8 illustrate one method of forming a lower electrode for a container structure according to the present invention. The lower electrode of the capacitor structure shown in FIG. 8 can be formed using a recessed layer of hemispherical grain silicon manufactured by the methods of the present invention.

FIG. 1 illustrates a substrate assembly 10 including a first substrate portion 12 and a second substrate portion 14. Substrate portion 14 is formed on substrate portion 12 and includes a cavity 20 defined therein by a bottom surface 22 on the first substrate portion 12 and one or more side walls 24 of second substrate portion 14. The first substrate portion 12 may include a region (not shown) to which a lower electrode 30 of the capacitor structure (see FIG. 8) can be electrically connected.

The second portion 14 of the substrate assembly 10 is preferably an insulative layer such as an oxide layer, e.g., silicon dioxide, BPSG, PSG, etc. In one embodiment of the invention, the second substrate portion 14 is a layer of BPSG, although other materials that allow for proper cavity formation may be used for the substrate assembly 10. Also, although each portion of the substrate assembly 10 is depicted as a homogenous, single layer, each portion of the substrate assembly 10 may be provided as a non-homogeneous layer and/or multiple layers of the same or different materials.

Cavity 20 is defined in substrate assembly 10 by bottom surface 22 and the one or more side walls 24, referred to below as sidewall structure 24. It is preferred, but not required, that the bottom surface 22 of the cavity 20 be formed by an exposed portion of the first substrate portion 12 and that the sidewall structure 24 of the cavity 20 are formed by the second substrate portion 14. Furthermore, it is preferred that the sidewalls 24 are substantially vertical where the upper surface 16 of the second substrate portion 14 defines a horizontal plane. By "substantially vertical" it is meant that the sidewalls 24 form an angle of 90 degrees plus or minus several degrees with the upper surface 16 of the second substrate portion 14. When the terms "vertical" or "normal" are used in this disclosure, exact verticality is not required, as perfect geometric relationships exist only in theory.

The cavity 20 may have any desired shape that is conducive to use as a capacitor. In some instances, the cavity 20 may be generally cylindrical and in other cases the cavity 20 may be elongated along one axis to form a tub-shaped or trench capacitor structure. Also, although the capacitor structures are described herein in the context of container capacitors (i.e., those fabricated at least partly above the level of the access transistor gates), the present invention may also be applied to the formation of capacitors in a substrate. In other variations, the methods of providing recessed hemispherical grain silicon layers described herein may be used for one or more numerous applications, e.g., interconnection applications, capacitor applications, etc.

The present invention is useful when forming recessed hemispherical grain silicon layers in small, high aspect ratio openings or cavities. As described herein, small high aspect ratio openings have feature sizes or critical dimensions below about 1 micron (e.g., such as a diameter or width of an opening being less than about 1 micron), and aspect ratios greater than about 1. Such aspect ratios are applicable to contact holes, vias, trenches, and any other configured openings, such as container or trench openings for formation of capacitor structures. For example, a trench having an opening of 1 micron and a depth of 3 microns has an aspect ratio of 3.

Figure 6:
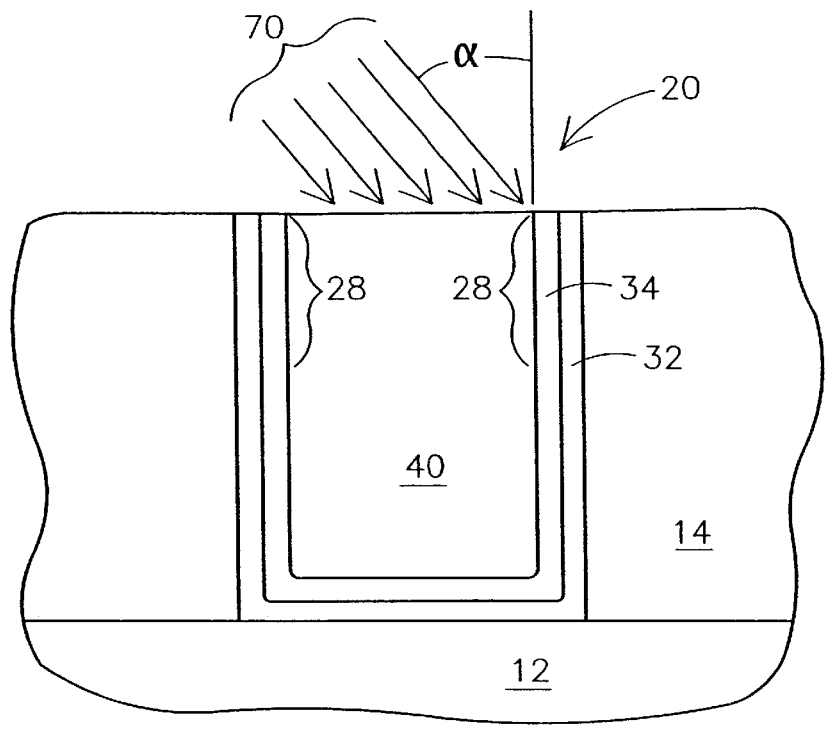
FIG. 6 is a cross-sectional view of the capacitor structure of FIG. 5 illustrating selective doping of a portion of the second layer 34.
Figure 7:
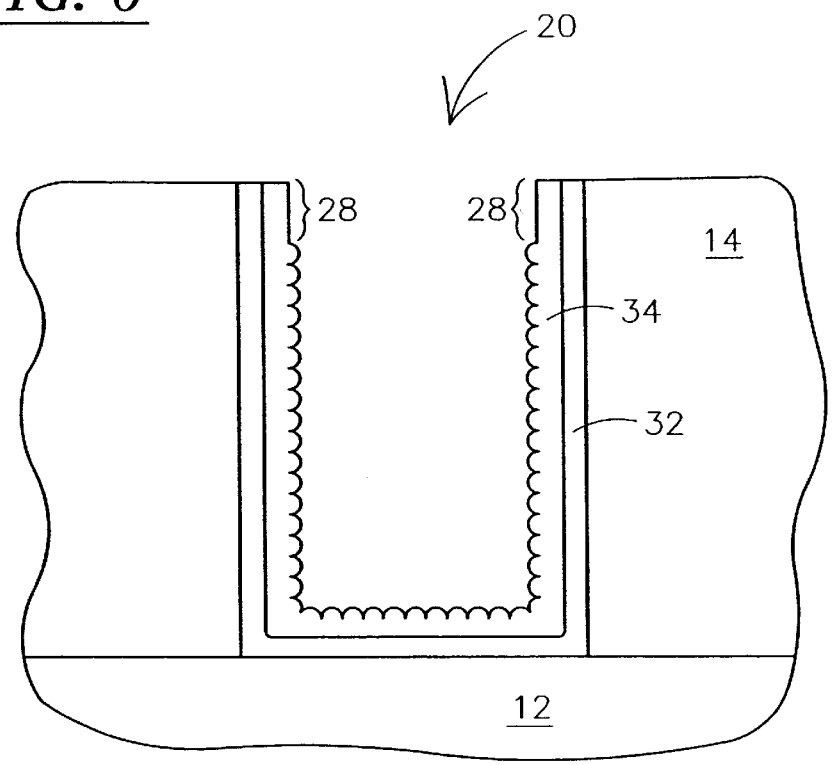
FIG. 7 is a cross-sectional view of the capacitor structure of FIG. 6 following removal of the fill material and formation of hemispherical grain silicon from the undoped portion of the second layer 34.
Figure 8:
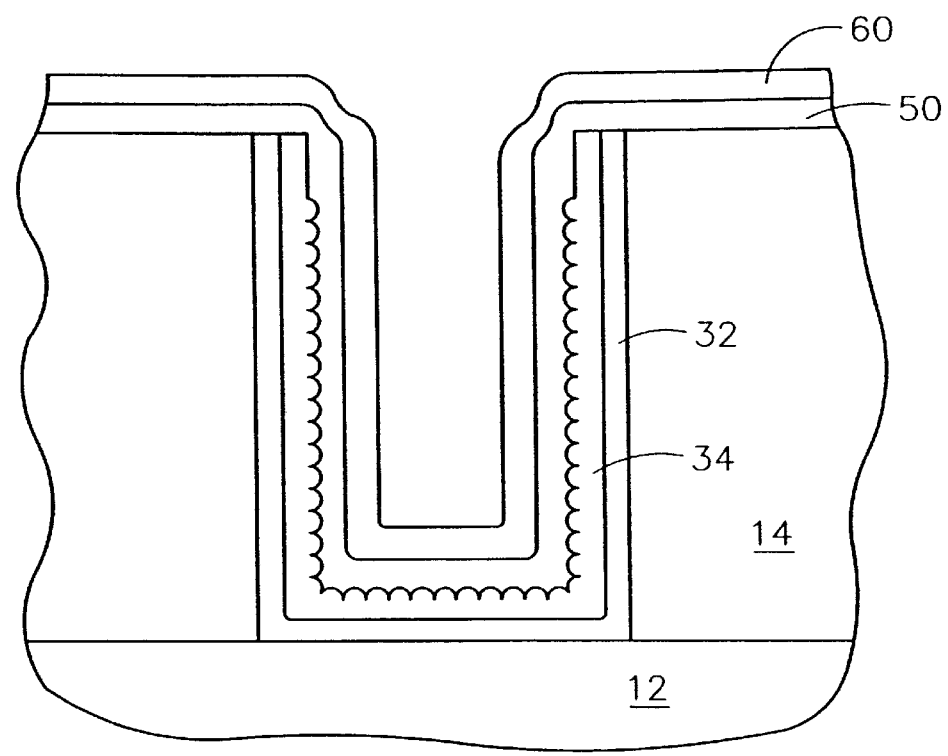
FIG. 8 is cross-sectional view of the capacitor structure of FIG. 6 following formation of a dielectric layer 50 and a second electrode layer 60.

The capacitor structure of FIG. 8 is formed with a recessed hemispherical grain lower electrode as illustrated in FIGS. 1–8 by providing a first layer 32 in the cavity 20 and on surfaces such as upper surface 16 of second substrate portion 14.

The first layer 32 and the other layers described herein are preferably deposited using CVD processes such that conformal coverage or step coverage within the cavity 20 and at various other portions of the structure, such as corners 26, are conformally covered with the material being deposited.

The first layer 32 is preferably electrically conductive because it will form a portion of one electrode in a capacitor as described below. In one embodiment of the invention, the first layer 32 is formed using doped silicon, more preferably the first layer 32 consists essentially of doped silicon. The doped silicon used for the first layer 32 may be either doped amorphous silicon or doped polysilicon.

The first layer 32 preferably covers the upper surface 16 of the second substrate portion 14 and conformally lines the bottom 22 and sidewalls 24 of cavity 20. It will also be noted that, where the cavity 20 is cup-shaped, the first layer 32 preferably conformally forms a cup-shaped structure within the cavity 20.

Figure 3:
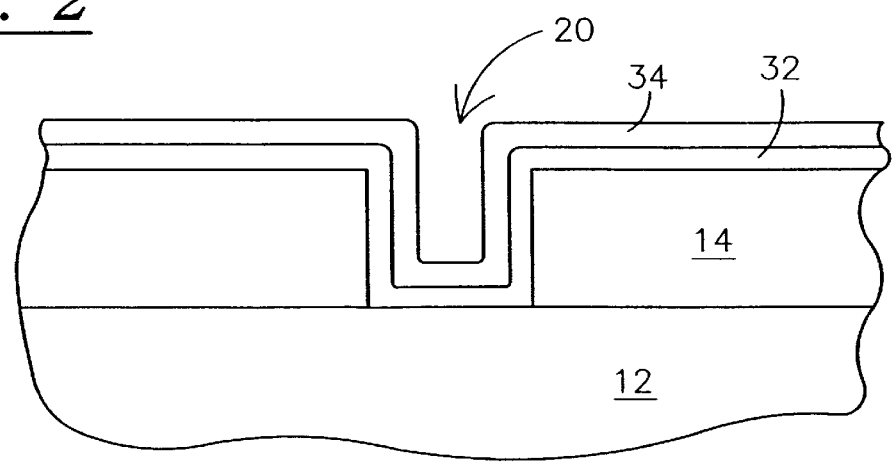
FIG. 3 is a cross-sectional view of the capacitor structure of FIG. 2 following formation of a second layer 34 on the first layer 32.

Referring to FIG. 3, a second layer 34 is then formed on the first layer 32 via any suitable technique. The second layer 34 preferably conformally covers the first layer 32 both inside and outside the cavity 20.

The second layer 34 may alternately be referred to a hemispherical grain silicon precursor layer because it should be formed of materials that are amenable to the formation of hemispherical grain silicon. As a result, the second layer includes some silicon in its composition. In one embodiment of the invention, the second layer 34 is formed of undoped amorphous silicon, more preferably the second layer 34 consists essentially of undoped amorphous silicon. Although it may be preferred that the hemispherical grain silicon precursor in the second layer 34 is substantially undoped, it may be possible that the hemispherical grain silicon precursor in the second layer 34 includes a dopant, provided that the dopant concentration in the second layer 34 does not prevent hemispherical grain silicon formation.

Figure 4:
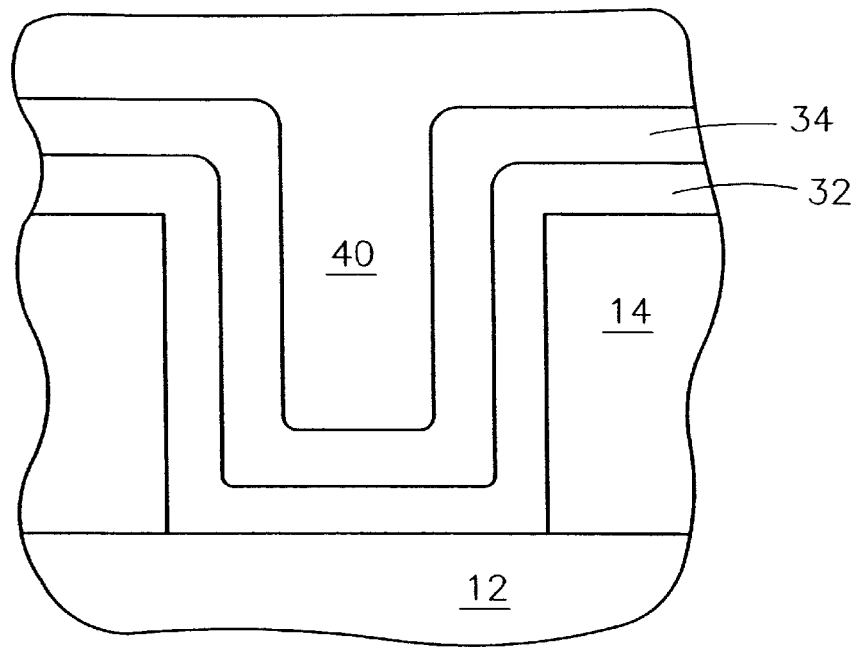
FIG. 4 is a cross-sectional view of the capacitor structure of FIG. 3 following formation of a layer of fill material 40 in the cavity 20.

After the first layer 32 and the second layer 34 are deposited, the cavity 20 may optionally be filled with a suitable fill material 40 as illustrated in FIG. 4. Typically, the fill material 40 will be provided in the form of a planarizing layer, i.e., a layer applied in sufficient amounts to fill the cavities 20 and provide a generally continuous layer of the fill material on the upper surfaces of the structure between the cavities 20. Examples of suitable fill materials 40 include but are not limited to photoresists; spin-on-glass (SOG); and low temperature deposited (e.g., less than 500° C.) silicon oxide, silicon oxynitride, or silicon nitride.

Figure 5:
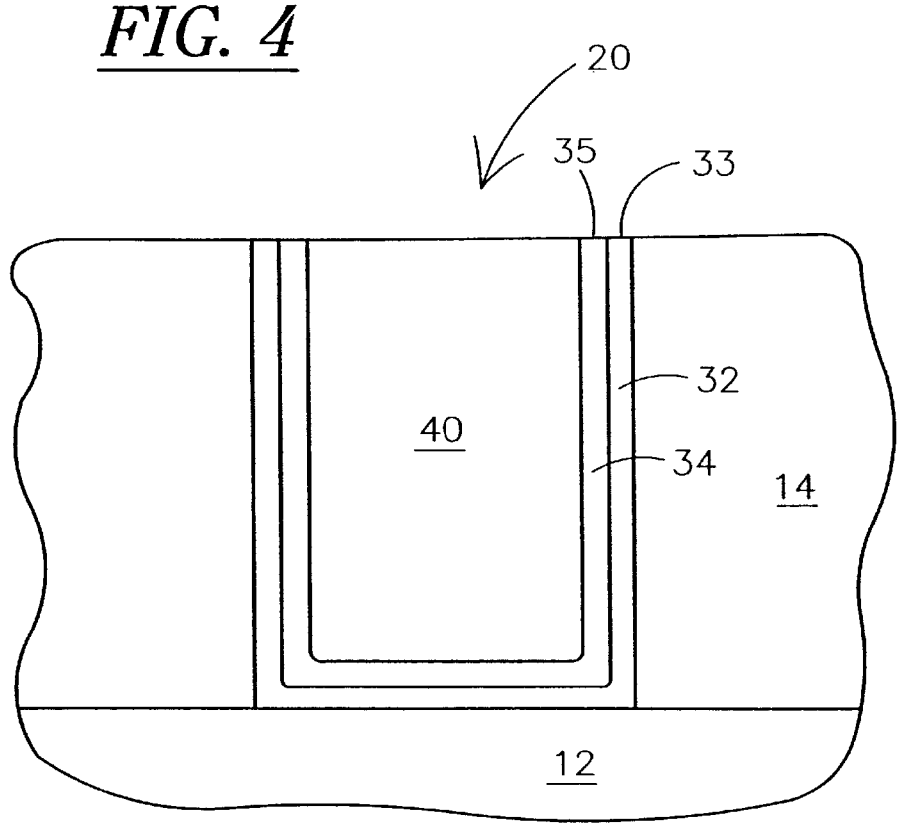
FIG. 5 is cross-sectional view of the capacitor structure of FIG. 4 following planarization to remove the fill material 40 outside of the cavity 20.

After the fill material 40 is applied to the structure, the portions of the first layer 32, the second layer 34 and the fill material 40 outside of the cavity 20 may optionally be removed as illustrated in FIG. 5. As a result, the first layer 32, second layer 34 and fill material 40 within each cavity 20 are separated from the corresponding layers in other cavities 20. Removal of the exposed portions of the first layer 32, second layer 34 and fill material 40 can be performed by any suitable technique. For example, a chemical-mechanical polishing (CMP) technique may be practiced on the array to remove the exposed portions of the first layer 32, second layer 34 and fill material 40, i.e., those portions outside of the cavity 20.

After removal of the first layer 32, second layer 34 and the fill material 40 (if any) from the areas outside of the cavity 20, an edge 33 of the first layer 32 and an edge 35 of the second layer 34 are exposed about the upper perimeter of the cavity 20 as illustrated in FIG. 5. That structure can then be subjected to an ion implantation process in which an upper portion, referred to herein as an edge zone 28, of the second layer 34 is implanted with an N-type dopant, P-type dopant, or other species such as oxygen or nitrogen that can prevent conversion of the hemispherical grain silicon precursor in the second layer 34 to hemispherical grain silicon.

The dopant is implanted at a concentration level that substantially reduces, more preferably substantially prevents, formation of hemispherical grain silicon from the second layer 34 in the edge zone 28. In other words, the silicon in the second layer 34 within the edge zone 28 no longer functions as a "hemispherical grain silicon precursor" as described above.

The depth of the edge zone 28 relative can be measured by a number of techniques. For example, the edge zone depth may be determined based on a percentage of the depth of the cavity 20 itself. The depth of the cavity 20 is determined before the first layer 32 and the second layer 34 are deposited and is measured along a vertical axis from the upper surface 16 of the second substrate portion 14 to the bottom 22 of the cavity 20. When measured as a percentage of cavity depth, it may be preferred that the depth of the edge zone 28 be about 20% or less of the cavity depth, more preferably about 10% or less, and even more preferably about 5% or less. It is further preferred that the edge zone 28 have some depth, i.e., that the depth of the edge zone 28 is greater than 0%.

The depth of the edge zone 28 may alternatively be measured in terms of distance from the upper surface 16 of the second substrate portion 14 to the bottom of the edge zone 28 along a substantially vertical axis after processing to reach the structure depicted in FIG. 6. When so measured, it may be preferred that the edge zone depth be about 2000 Angstroms or less, more preferably about 1000 Angstroms or less, and even more preferably about 500 Angstroms or less. It is further preferred that the edge zone 28 have some depth, i.e., that the depth of the edge zone 28 is greater than zero.

Control over the dopant implantation depth, which corresponds to the depth of the edge zone 28, can be achieved in a number of ways. Depth control can be achieved, at least in part, by the energy level imparted to the ions. Energy levels used in the implantation process will vary depending on the materials in the cavity, the dopant used and the desired edge zone depth. Depth control may also be achieved, at least in part, by controlling the implantation angle α, i.e., the angle formed between the direction of travel of the ions 70 and the sidewalls 24 of the cavity 20 as illustrated in FIG. 6.

In one method where the implantation angle α is zero, i.e., the direction of travel of the ions is generally aligned with the sidewalls 24 of the cavity 20, implant depth control is exercised by the energy level of the dopant ions. It is important that in this method some fill material 40 be present in the cavity 20 to prevent a significant number of dopant ions 70 from reaching the second layer 34 at the bottom 22 of the cavity 20. If a significant number of the dopant ions do reach the material of the second layer 34 below the depth of the desired edge zone 28, then proper hemispherical grain silicon conversion of the hemispherical grain silicon precursor in the second layer 34 below the edge zone 28 may be disrupted.

In addition to, or in place of, reliance on energy levels to control implant depth, it may be desirable to rely on an implantation angle α that is greater than zero. By directing the dopant ions 70 at an implantation angle α that is greater than zero, preferably about 5 degrees or more, and more preferably about 45 degrees or more, the lower portions of the second layer 34 within the cavity 20 will be protected from dopant implantation by shadowing of the opposite side of the cavity 20. Those undoped portions of the hemispherical grain silicon precursor in the second layer 34 below the edge zone 28 remain convertible to hemispherical grain silicon, while the doped portions in the edge zone 28 do not convert to hemispherical grain silicon.

Even in those methods in which implantation angle is relied on to control the implantation depth, however, it may also be desirable to control implantation energy levels. By controlling energy levels in addition to implantation angle, more precise control over implantation depth may be attained.

Following selective doping of the portion of the second layer 34 in the edge zone 28, the fill material (if any) within the cavity 20 can be removed by any suitable technique. Preferred techniques for removal of the fill material 40 are those that leave the remainder of the structure substantially unaffected. If the fill material 40 is a photoresist, it can be, e.g., chemically stripped from the cavity 20.

The undoped portions of the second layer 34 below the edge zone 28 can be converted to hemispherical grain silicon via any suitable technique. The resulting structure is illustrated in FIG. 7. The edge zone 28 of doped silicon from the second layer 34 that was created about the upper portions of the sidewall structure 24 of the cavity 20 does not convert to hemispherical grain silicon as does the undoped silicon. Because the hemispherical grain silicon is recessed within the cavity 20, subsequent processing steps are unlikely to dislodge grains of HSG silicon that could fall outside of the cavity 20 and short adjacent capacitor structures or cause other defects.

Formation of hemispherical grain silicon from second layer 34 may take place via any suitable technique. For example, the second layer 34 may be seeded and annealed under conditions suitable to the formation of hemispherical grain silicon. A variety of techniques useful in the formation of hemispherical grain silicon may be used. Examples include, but are not limited to those described in U.S. Pat. No. 5,407,534; 5,418,180; 5,837,580; 5,759,262; and 5,882,979. The first layer 32 and doped portions of the second layer 34 are preferably not converted to hemispherical grain silicon. If, for example, the first layer 32 is doped amorphous silicon, it may not convert to hemispherical grain silicon under the same conditions as will the substantially undoped amorphous silicon portions of the second layer 34.

As a result of the hemispherical grain silicon conversion process, some diffusion of the dopant from the preferred doped polysilicon of the first layer 32 into the hemispherical grain silicon of the second layer 34 may be experienced, although such diffusion is typically limited.

The result of the hemispherical grain silicon formation from second layer 34 is a first electrode 30 as illustrated in FIG. 7, where the first electrode 30 is the combination of first layer 32 and hemispherical grain silicon in the second layer 34. After completion of the first electrode 30 and cavity structure as depicted in FIG. 7, a dielectric layer 50 can be provided within the cavity 20 on the first electrode 30. Although not shown, at least some of the second substrate portion 14 outside of the first layer 32 may also be removed to allow the outside surface of the first layer 32 to further contribute to overall capacitance.

The dielectric layer 50 may be any suitable material having a suitable dielectric constant. Preferably, a suitable dielectric is a high dielectric constant material such as those materials having a dielectric constant of greater than about 25. Suitable dielectric constant materials for forming dielectric layer 50 may include, but are not limited to: tantalum pentoxide ($Ta_2O_5$), $Ba_xSr(1-x)TiO_3$ [BST], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $KNO_3$, $LiNbO_3$, and combinations of any two or more of these materials.

Further, after formation of the dielectric layer 50, a second electrode 60 can be formed on the dielectric material 50 opposite from the first electrode 30. The second electrode 60 may be formed of any suitably conductive material. Examples include, but are not limited to: doped polysilicon, tungsten nitride, titanium nitride, tantalum nitride, platinum metals and alloys thereof, ruthenium, and ruthenium oxide. The dielectric layer 50 and second electrode layer 60 can then be selectively removed from outside of the cavity 20 to form the desired capacitor structure. Such a structure may or may not include removal of all or a portion of the second substrate portion 14.

A more specific illustration of using the above-described processes is described below with reference to FIG. 9 wherein a rough conductive first electrode 130 is formed according to one of the processes described herein for a high dielectric capacitor of a storage cell. There are other semiconductor processes and structures for various devices, e.g., CMOS devices, memory devices, etc., that would benefit from the present invention and in no manner is the present invention limited to the illustrative capacitor electrode structure described herein.

Figure 9:
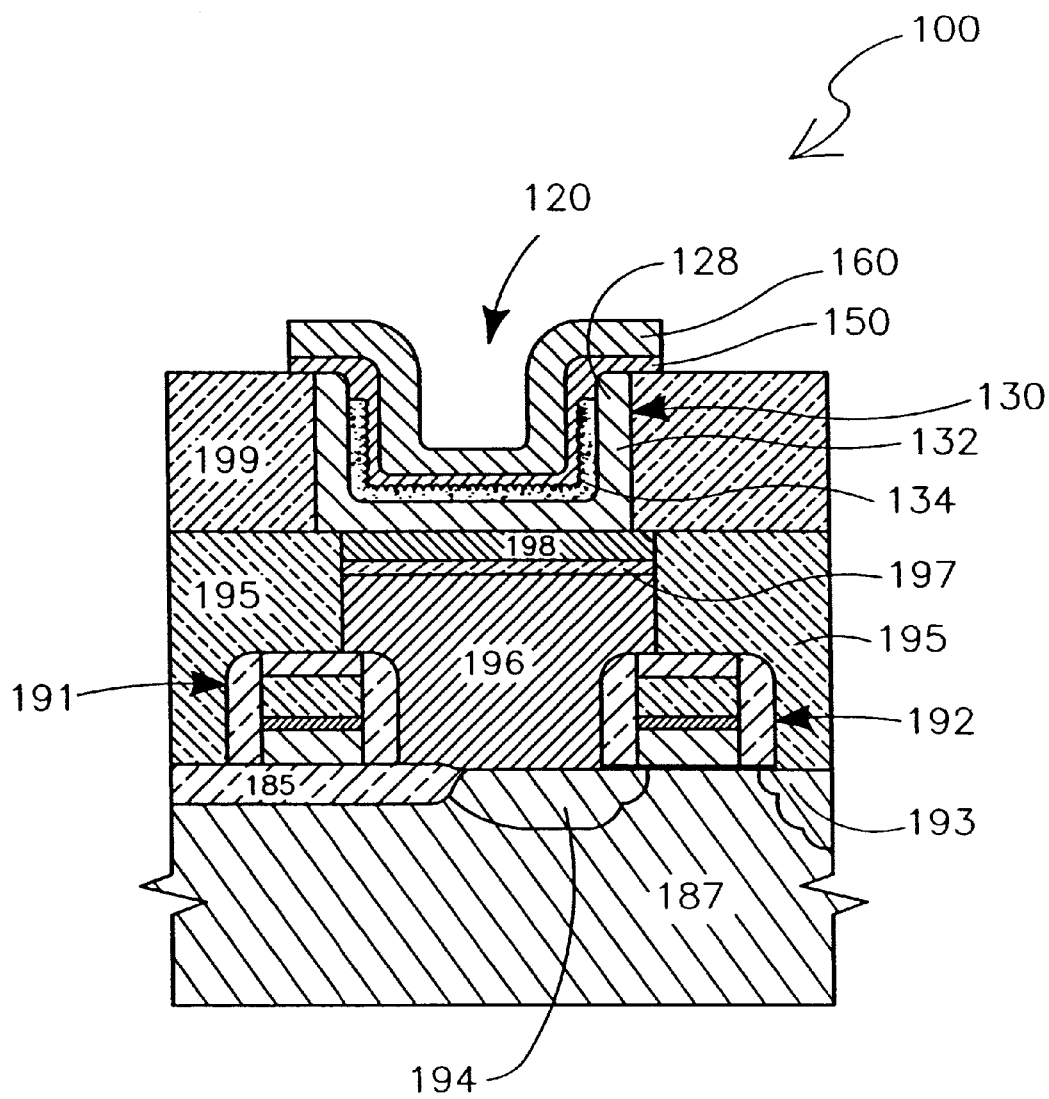
FIG. 9 is an illustrative diagram of a container capacitor structure using a recessed hemispherical grain electrode formed according to the present invention in a storage cell capacitor application.

As shown in FIG. 9, a device structure 100 is fabricated in accordance with conventional processing techniques through the formation of a cavity 120. Such processing is performed prior to depositing a first electrode structure 130 on the surfaces defining the cavity 120 using the methods in accordance with the present invention. The first electrode 130 is formed according to the methods described above and, as such, includes a conductive layer 132 and a recessed hemispherical grain silicon layer 134 including an edge zone 128.

As described in U.S. Patent No. 5,392,189 to Fazan et al., entitled "Capacitor Compatible with High Dielectric Constant Materials Having Two Independent Insulative Layers and the Method for Forming Same," issued Feb. 21, 1995, the device structure 100 includes field oxide regions 185 and active regions, i.e., those regions of the substrate 187 not covered by field oxide. A word line 191 and a field effect transistor (FET) 192 are formed relative to the field oxide 185. Suitable source/drain regions 193, 194 are created in silicon substrate 187. An insulative conformal layer of oxide material 195 is formed over regions of FET 192 and word line 191. A polysilicon plug 196 is formed to provide electrical communication between substrate 187 and a storage cell capacitor to be formed thereover. Various barrier layers are formed over the polysilicon plug 196, such as, for example, layers 197 and 198. For example, such layers may be titanium nitride, tungsten nitride, or any other metal nitride which acts as a barrier. Thereafter, another insulative layer 199 is formed and the opening 120 is defined therein.

The device structure 100 includes a dielectric layer 150 formed of material such as described above is then formed relative to the first electrode 130. Following formation of the layer of dielectric material, a second electrode 160 is formed relative to the dielectric layer 150, such that the first electrode 130, dielectric layer 150 and second electrode 160 form a capacitor as a part of device structure 100.

All patents, patent documents and other references cited herein are incorporated in their entirety as if each were incorporated separately. This invention has been described with reference to illustrative embodiments and is not meant to be construed in a limiting sense. As described previously, one skilled in the art will recognize that various other illustrative applications may utilize the recessed hemispherical grain silicon layers as described herein. Various modifications of the illustrative embodiments, as well as additional embodiments of the invention, will be apparent to persons skilled in the art upon reference to this description. It is therefore contemplated that the appended claims will cover any such modifications or embodiments that may fall within the scope of the present invention as defined by the accompanying claims.

What is claimed is:

1. A method of forming a capacitor structure comprising:
   providing a cavity in a substrate, the cavity comprising a sidewall structure, an opening in the upper surface of the substrate, and a bottom opposite the opening of the cavity;
   providing a first layer on an inner surface of the sidewall structure, wherein the first layer is electrically conductive;

providing a second layer on substantially all of the first layer, the second layer comprising hemispherical grain silicon precursor;

selectively doping the hemispherical grain silicon precursor in the second layer within an edge zone on the sidewall structure, the edge zone extending from the opening of the cavity towards the bottom of the cavity; and converting the undoped hemispherical grain silicon precursor in the second layer to hemispherical grain silicon, wherein the edge zone is substantially free of the hemispherical grain silicon.

2. A method according to claim 1, wherein the first layer comprises doped silicon.

3. A method according to claim 1, wherein the first layer consists essentially of doped silicon.

4. A method according to claim 1, wherein the hemispherical grain silicon precursor comprises substantially undoped amorphous silicon.

5. A method according to claim 1, wherein the hemispherical grain silicon precursor consists essentially of substantially undoped amorphous silicon.

6. A method of forming a capacitor structure comprising:

providing a cavity in a substrate, the cavity comprising a sidewall structure, an opening in the upper surface of the substrate, and a bottom opposite the opening of the cavity;

providing a first layer on an inner surface of the sidewall structure, wherein the first layer is electrically conductive;

providing a second layer on substantially all of the first layer, the second layer comprising hemispherical grain silicon precursor;

selectively doping the hemispherical grain silicon precursor in the second layer within an edge zone on the sidewall structure, the edge zone extending from the opening of the cavity towards the bottom of the cavity, wherein selectively doping comprises implanting the hemispherical grain silicon precursor in the second layer with a dopant; and converting the undoped hemispherical grain silicon precursor in the second layer to hemispherical grain silicon, wherein the edge zone is substantially free of the hemispherical grain silicon.

7. A method according to claim 6, wherein the dopant is electrically conductive.

8. A method of forming a capacitor structure comprising:

providing a cavity in a substrate, the cavity comprising a sidewall structure, an opening in the upper surface of the substrate, and a bottom opposite the opening of the cavity;

providing a first layer on an inner surface of the sidewall structure, wherein the first layer is electrically conductive;

providing a second layer on substantially all of the first layer, the second layer comprising hemispherical grain silicon precursor;

selectively doping the hemispherical grain silicon precursor in the second layer within an edge zone on the sidewall structure, the edge zone extending from the opening of the cavity towards the bottom of the cavity, wherein selectively doping comprises implanting the hemispherical grain silicon precursor in the second layer with a dopant, the dopant being directed at an implantation angle relative to the sidewall structure of the cavity; and converting the undoped hemispherical grain silicon precursor in the second layer to hemispherical grain silicon, wherein the edge zone is substantially free of the hemispherical grain silicon.

9. A method according to claim 8, wherein the dopant is electrically conductive.

10. A method according to claim 8, wherein the implantation angle is about 5 degrees or more.

11. A method according to claim 8, wherein the implantation angle is about 45 degrees or more.

12. A method of forming a capacitor structure comprising:

providing a cavity in a substrate, the cavity comprising a sidewall structure, an opening in the upper surface of the substrate, and a bottom opposite the opening of the cavity;

providing a first layer on an inner surface of the sidewall structure, wherein the first layer is electrically conductive;

providing a second layer on substantially all of the first layer, the second layer comprising hemispherical grain silicon precursor;

selectively doping the hemispherical grain silicon precursor in the second layer within an edge zone on the sidewall structure, the edge zone extending from the opening of the cavity towards the bottom of the cavity;

providing a fill material within the cavity before selectively doping the hemispherical grain silicon precursor in the second layer; and converting the undoped hemispherical grain silicon precursor in the second layer to hemispherical grain silicon, wherein the edge zone is substantially free of the hemispherical grain silicon.

13. A method according to claim 12, wherein the fill material substantially prevents the dopant from reaching the hemispherical grain silicon precursor in the second layer outside of the edge zone.

14. A method of forming a capacitor structure comprising:

providing a cavity in a substrate, the cavity comprising a sidewall structure, an opening in the upper surface of the substrate, and a bottom opposite the opening of the cavity;

providing a first layer on an inner surface of the sidewall structure, wherein the first layer is electrically conductive;

providing a second layer on substantially all of the first layer, the second layer comprising hemispherical grain silicon precursor;

selectively doping the hemispherical grain silicon precursor in the second layer within an edge zone on the sidewall structure, the edge zone extending from the opening of the cavity towards the bottom of the cavity, wherein selectively doping comprises implanting the hemispherical grain silicon precursor in the second layer with a dopant;

providing a fill material within the cavity before selectively doping the hemispherical grain silicon precursor in the second layer; and converting the undoped hemispherical grain silicon precursor in the second layer to hemispherical grain silicon, wherein the edge zone is substantially free of the hemispherical grain silicon.

15. A method according to claim 14, wherein the dopant is electrically conductive.

16. A method according to claim 14, wherein the fill material substantially prevents the dopant from reaching the hemispherical grain silicon precursor in the second layer outside of the edge zone.

17. A method of forming a capacitor structure comprising:
provide a cavity in a substrate, the cavity comprising a sidewall structure, an opening in the upper surface of the substrate, and a bottom opposite the opening of the cavity;
providing a first layer on an inner surface of the sidewall structure, wherein the first layer is electrically conductive;
providing a second layer on substantially all of the first layer, the second layer comprising hemispherical grain silicon precursor;
selectively doping the hemispherical grain silicon precursor in the second layer within an edge zone on the sidewall structure, the edge zone extending from the opening of the cavity towards the bottom of the cavity, wherein selectively doping comprises implanting the hemispherical grain silicon precursor in the second layer with a dopant, the dopant being directed at an implantation angle relative to the sidewall structure of the cavity;
providing a fill material within the cavity before selectively doping the hemispherical grain silicon precursor in the second layer; and
converting the undoped hemispherical grain silicon precursor in the second layer to hemispherical grain silicon, wherein the edge zone is substantially free of the hemispherical grain silicon.

18. A method according to claim 17, wherein the dopant is electrically conductive.

19. A method according to claim 17, wherein the fill material substantially prevents the dopant from reaching the hemispherical grain silicon precursor in the second layer outside of the edge zone.

20. A method according to claim 17, wherein the implantation angle is about 0 degrees.

21. A method according to claim 17, wherein the implantation angle is about 5 degrees or more.

22. A method according to claim 17, wherein the implantation angle is about 45 degrees or more.

23. A method of forming a capacitor structure comprising:
providing a cavity in a substrate, the cavity comprising a sidewall structure, an opening in the upper surface of the substrate, and a bottom opposite the opening of the cavity;
providing a first layer on an inner surface of the sidewall structure, wherein the first layer is electrically conductive;
providing a second layer on substantially all of the first layer, the second layer comprising hemispherical grain silicon precursor;
selectively doping the hemispherical grain silicon precursor in the second layer within an edge zone on the sidewall structure, the edge zone extending from the opening of the cavity towards the bottom of the cavity; and
converting the undoped hemispherical grain silicon precursor in the second layer to hemispherical grain silicon, wherein the edge zone is substantially free of the hemispherical grain silicon, and further wherein the edge zone extends over at least about 20% or less of the distance between the opening and the bottom of the cavity.

24. A method according to claim 23, wherein the edge zone extends over at least about 10% or less of the distance between the opening and the bottom of the cavity.

25. A method of forming a capacitor structure comprising:
providing a cavity in a substrate, the cavity comprising a sidewall structure, an opening in the upper surface of the substrate, and a bottom opposite the opening of the cavity;
providing a first layer on an inner surface of the sidewall structure, wherein the first layer is electrically conductive;
providing a second layer on substantially all of the first layer, the second layer comprising hemispherical grain silicon precursor;
selectively doping the hemispherical grain silicon precursor in the second layer within an edge zone on the sidewall structure, the edge zone extending from the opening of the cavity towards the bottom of the cavity; and converting the undoped hemispherical grain silicon precursor in the second layer to hemispherical grain silicon, wherein the edge zone is substantially free of the hemispherical grain silicon, and further wherein the edge zone has a depth of about 2000 Angstroms or less from the opening of the cavity.

26. A method according to claim 25, wherein the edge zone has a depth of about 1000 Angstroms or less from the opening of the cavity.

27. A method according to claim 1, wherein the cavity is cup-shaped.

* * * * *

UNITED STATES PATENT AND TRADEMARK OFFICE
CERTIFICATE OF CORRECTION

PATENT NO. : 6,326,277 B1  Page 1 of 1
DATED : December 4, 2001
INVENTOR(S) : DeBoer It is certified that error appears in the above-identified patent and that said Letters Patent is hereby corrected as shown below:

Column 9,
Line 48, please delete "$Ba_xSr(1-x)$" and insert -- $Ba_xSr_{(1-x)}$ --.

Signed and Sealed this

Twenty-third Day of July, 2002

Attest:

Attesting Officer

JAMES E. ROGAN
*Director of the United States Patent and Trademark Office*